United States Patent
Ito et al.

(10) Patent No.: US 11,214,731 B2
(45) Date of Patent: Jan. 4, 2022

(54) LIGHT WAVELENGTH CONVERSION MEMBER AND LIGHT EMITTING DEVICE

(71) Applicant: NGK SPARK PLUG CO., LTD., Nagoya (JP)

(72) Inventors: Tsuneyuki Ito, Nagoya (JP); Yusuke Katsu, Nagoya (JP); Shohei Takaku, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 235 days.

(21) Appl. No.: 16/488,847

(22) PCT Filed: Nov. 10, 2017

(86) PCT No.: PCT/JP2017/040613
§ 371 (c)(1),
(2) Date: Aug. 26, 2019

(87) PCT Pub. No.: WO2018/154869
PCT Pub. Date: Aug. 30, 2018

(65) Prior Publication Data
US 2020/0392401 A1 Dec. 17, 2020

(30) Foreign Application Priority Data
Feb. 27, 2017 (JP) .............................. JP2017-034682

(51) Int. Cl.
*H01L 33/50* (2010.01)
*C09K 11/02* (2006.01)
(Continued)

(52) U.S. Cl.
CPC .......... *C09K 11/02* (2013.01); *C09K 11/7774* (2013.01); *F21V 9/30* (2018.02); *H01L 33/502* (2013.01)

(58) Field of Classification Search
CPC .... C09K 11/02; C09K 11/7774; H01L 33/502
(Continued)

(56) References Cited

U.S. PATENT DOCUMENTS

| | | |
|---|---|---|
| 2008/0187746 A1 | 8/2008 | De Graaf et al. |
| 2009/0189507 A1 | 7/2009 | Winkler et al. |

(Continued)

FOREIGN PATENT DOCUMENTS

| | | |
|---|---|---|
| CN | 104900786 A | 9/2015 |
| EP | 0 617 300 A1 | 9/1994 |

(Continued)

OTHER PUBLICATIONS

International Search Report (PCT/ISA/210) dated Feb. 6, 2018 issued by the International Searching Authority in International Application No. PCT/JP2017/040613.
(Continued)

*Primary Examiner* — Christopher M Raabe
(74) *Attorney, Agent, or Firm* — Sughrue Mion, PLLC

(57) ABSTRACT

An optical wavelength conversion member (9) provided with a ceramic plate (11) which is configured from a polycrystalline body that is mainly composed of $Al_2O_3$ and a component represented by $A_3B_5O_{12}$:Ce; and each of A and B in $A_3B_5O_{12}$ represents at least one element selected from the element groups described below. In addition, a dielectric multilayer film (13) which transmits a specific wavelength and reflects another specific wavelength is formed on a light incident surface (11a) of the ceramic plate (11). The ceramic plate (11) has a porosity of 2% by volume or less, while having an average surface roughness (an arithmetic mean roughness Sa) of 0.5 μm or less. A: Sc, Y and lanthanoids (excluding Ce) B: Al and Ga. Also disclosed is a light-emitting device including the optical wavelength conversion member.

10 Claims, 3 Drawing Sheets

(51) Int. Cl.
 *F21V 9/30* (2018.01)
 *C09K 11/77* (2006.01)
(58) Field of Classification Search
 USPC .......................................................... 257/98
 See application file for complete search history.

(56) References Cited

U.S. PATENT DOCUMENTS

| 2011/0181173 | A1  | 7/2011  | De Graaf et al. |
| 2011/0210658 | A1* | 9/2011  | Pan ................ C04B 35/44 |
|              |     |         | 313/112 |
| 2012/0045634 | A1  | 2/2012  | Irie et al. |
| 2013/0105850 | A1  | 5/2013  | Komatsu et al. |
| 2013/0256599 | A1  | 10/2013 | Irie |
| 2015/0247618 | A1  | 9/2015  | Irie |
| 2015/0372200 | A1  | 12/2015 | Seko et al. |

FOREIGN PATENT DOCUMENTS

| GN | 103026515    | A  | 4/2013  |
| JP | 6-302302     | A  | 10/1994 |
| JP | 2009-540069  | A  | 11/2009 |
| JP | 5088977      | B2 | 12/2012 |
| JP | 5490407      | B2 | 5/2014  |
| JP | 5650885      | B2 | 1/2015  |
| JP | 2015-069884  | A  | 4/2015  |
| JP | 2015-119046  | A  | 6/2015  |
| JP | 5740017      | B2 | 6/2015  |
| JP | 2016-9693    | A  | 1/2016  |
| JP | 2016-21582   | A  | 2/2016  |
| JP | 2016-60859   | A  | 4/2016  |
| JP | 2016-138034  | A  | 8/2016  |

OTHER PUBLICATIONS

Communication dated Oct. 18, 2018, issued by the Taiwanese Patent Office in counterpart Taiwanese Application No. 107105900.
Communication dated May 12, 2020 from the Japanese Patent Office in application No. 2017-034682.
Extended European Search Report dated Jan. 15, 2021, issued in corresponding European patent application No. 17898117.1.
Office Action dated Jun. 7, 2021, issued by the State Intellectual Property Office of P.R. China in corresponding Chinese Patent Application No. 201780087449.8.
Greskovich et al., "Improved polycrystalline ceramic lasers," Journal of Applied Physics, vol. 45, No. 10, pp. 4495-4502, Oct. 1974 (9 pages total).

* cited by examiner (a)

(b)

LIGHT WAVELENGTH CONVERSION MEMBER AND LIGHT EMITTING DEVICE

CROSS REFERENCE TO RELATED APPLICATIONS

This application is a National Stage of International Application No. PCT/JP2017/040613, filed Nov. 10, 2017, claiming priority based on Japanese Patent Application No. 2017-034682, filed Feb. 27, 2017.

TECHNICAL FIELD

The present invention relates to an optical wavelength conversion (light wavelength conversion) member capable of converting light wavelength and used for, for example, in head lamps, lighting apparatuses, and optical apparatuses (e.g., projectors), and to a light-emitting device including the optical wavelength conversion member.

BACKGROUND ART

For example, a head lamp or a lighting apparatus generally includes a device for achieving white light through wavelength conversion, by means of a phosphor, of blue light emitted from a light-emitting diode (LED) or a laser diode (LD).

Hitherto, the matrix or material of the phosphor (or a fluorescent body) is, for example, a resin material or a glass material. In accordance with a trend for using a high-output light source in recent years, the phosphor is required to have higher durability. Thus, ceramic phosphors have received attention.

Known ceramic phosphors are formed of a Ce-activated garnet ($A_3B_5O_{12}$) component, such as $Y_3Al_5O_{12}$:Ce (YAG: Ce).

For example, the technique disclosed in Patent Document 1 involves formation of an $Al_2O_3$-YAG:Ce composite material exhibiting improved thermal resistance and thermal conductivity. The $Al_2O_3$-containing composite material formed through such a technique has thermal conductivity higher than that of a single YAG:Ce component, and thus exhibits improved thermal resistance and laser power resistance.

The technique disclosed in Patent Document 1 relates to a fired product containing a matrix phase formed of $Al_2O_3$, a main phosphor phase formed of a substance represented by the formula $A_3B_5O_{12}$:Ce (wherein A is at least one species selected from among Y, Gd, Tb, Yb, and Lu, and B is at least one species selected from among Al, Ga, and Sc), and a $CeAl_{11}O_{18}$ phase.

As disclosed in Patent Document 2, a recently proposed technique involves formation of a thin film having high porosity on the main radiation surface of a wavelength conversion layer of a fluorescent body for increasing the efficiency of light extraction from the wavelength conversion layer.

PRIOR ART DOCUMENTS

Patent Documents

Patent Document 1: Japanese Patent No. 5740017
Patent Document 2: Japanese Patent Application Laid-Open (kokai) No. 2016-60859

SUMMARY OF THE INVENTION

Problem to be Solved by the Invention

The aforementioned conventional techniques have problems as described below, and the problems are required to be solved.

Specifically, the technique disclosed in Patent Document 1 involves dispersing $CeAl_{11}O_{13}$ in the structure of a phosphor for preventing color unevenness (i.e., variation in color) due to Ce volatilization during a firing process. However, $CeAl_{11}O_{18}$ (i.e., a third component) absorbs light and thus causes a reduction in fluorescence intensity. Although such a problem needs to be solved through, for example, an extreme reduction in the thickness of the fluorescent body, a reduction in the thickness may cause impairment of the durability of the structure of the fluorescent body.

Similar to the case of the compounds disclosed in Patent Document 1, which contains a Ce:YAG compound, the presence of such a third component may cause a reduction in the emission intensity of a fluorescent body containing another material (e.g., a $CeAlO_3$ or $NdAl_{11}O_{18}$ material).

According to the technique disclosed in Patent Document 2, emitted light is diffused by means of the high-porosity thin film formed on the main radiation surface. However, the thin film contributes only to diffusion of light transmitting through the wavelength conversion layer toward the thin film; i.e., the thin film does not contribute to diffusion of another light (e.g., light scattering toward the light incident surface). Thus, the technique does not achieve sufficient light extraction efficiency, and encounters difficulty in increasing fluorescence intensity (i.e., emission intensity).

In view of the foregoing, an object of the present invention is to provide an optical wavelength conversion member capable of reducing color unevenness and achieving high light extraction efficiency and high emission intensity. Another object of the present invention is to provide a light-emitting device including the optical wavelength conversion member.

Means for Solving the Problem (1) A first aspect of the present invention provides an optical wavelength conversion member comprising a polycrystalline ceramic plate containing, as main components, $Al_2O_3$ and a component represented by $A_3B_5O_{12}$:Ce.

In the optical wavelength conversion member, each of A and B of the $A_3B_5O_{12}$ is at least one element selected from the following element groups:

A: Sc, Y, and lanthanoids (except for Ce), and
B: Al and Ga.

In addition, the ceramic plate has a porosity of 2 vol. % or less and an average surface roughness (arithmetic average roughness Sa) of 0.5 μm or less, and the ceramic plate has, on its surface located on one side in a thickness direction thereof (e.g., a light incident surface), a dielectric multilayer film including stacked translucent layers having different refractive indices.

In the first aspect, the aforementioned technical feature can achieve effective conversion of blue light into yellow light.

In the case where the translucent dielectric multilayer film is provided on a light incident surface on which, for example, laser light is incident from outside, the dielectric multilayer film can be modified so as to have a function of transmitting or reflecting light of a specific wavelength.

In the case of a YAG:Ce phosphor (i.e., optical wavelength conversion member), when a multilayer film has a function of transmitting blue light (wavelength: 465 nm) and reflecting light (wavelength: 520 nm or more) emitted from the phosphor, light emitted from the phosphor can be effectively extracted. As used herein, the term "light extraction efficiency" refers to the ratio of emitted light quantity to incident light quantity When the surface of the ceramic plate on which the dielectric multilayer film is formed has an average surface roughness (arithmetic average roughness Sa) of 0.5 µm or less, the formed thin film exhibits the aforementioned superior function (i.e., function of transmitting or reflecting light of a specific wavelength). An average surface roughness (arithmetic average roughness Sa) exceeding 0.5 µm is not preferred, since such an average surface roughness may cause failure to achieve an intended function or may lead to color unevenness (i.e., variation in color).

The formation of the aforementioned dielectric multilayer film requires the ceramic plate to have a smooth surface. Specifically, a porosity of the ceramic plate of 2 vol. % or less leads to a small number of pores exposed on the surface of the ceramic plate (i.e., a small number of dents on the surface), resulting in formation of a smooth dielectric multilayer film. This can reduce color unevenness. A porosity exceeding 2 vol. % is not preferred, since such a porosity may cause loss of the smoothness of the dielectric multilayer film, leading to color unevenness.

Thus, the aforementioned technical feature according to the first aspect can achieve, for example, reduced color unevenness and high light extraction efficiency, resulting in high fluorescence intensity (i.e., high emission intensity).

Furthermore, the optical wavelength conversion member (i.e., phosphor) according to the first aspect can be used with a high-output light source (e.g., laser) and exhibits high durability and high thermal resistance.

The aforementioned dielectric multilayer film is a layered product formed of films having different refractive indices (i.e., films of high refractive index and films of lower refractive index) and may be a well-known dichroic coating. Examples of materials of films of high refractive index include niobium oxide, titanium oxide, lanthanum oxide, tantalum oxide, yttrium oxide, gadolinium oxide, tungsten oxide, hafnium oxide, aluminum oxide, and silicon nitride. Examples of materials of films of low refractive index include silicon oxide.

(2) In a second aspect of the present invention, the ceramic plate has open pores at the interface between the dielectric multilayer film and the ceramic plate in a cross section of the optical wavelength conversion member cut toward a thickness direction; the number of open pores is 30 or less per 100 µm of the length of the interface; and each open pore has an opening size of 2 µm or less.

According to the second aspect, since the pores of the ceramic plate present at the interface between the dielectric multilayer film and the ceramic plate satisfy the aforementioned conditions, the dielectric multilayer film has smoothness and sufficiently exhibits the aforementioned functions. Thus, light emitted from the phosphor can be effectively extracted.

The presence of 30 or more open pores at the interface or the presence of open pores having an opening size exceeding 2 µm at the interface is not preferred, since this may cause loss of the smoothness of the film and occurrence of color unevenness.

The term "open pores at the interface" as used herein refers to dents in the ceramic plate that are concave with respect to the straight interface between the ceramic plate and the dielectric multilayer film. The term "opening size" as used herein refers to the length between the edges of each open pore (dent) at the straight interface having a length of 100 µm.

(3) In a third aspect of the present invention, the ceramic plate has an $A_3B_5O_{12}$:Ce content of 5 to 50 vol. %.

An $A_3B_5O_{12}$:Ce content of less than 5 vol. % may lead to an insufficient amount of fluorescent ceramic material, resulting in unsatisfactory fluorescence intensity. In contrast, an $A_3B_5O_{12}$:Ce content exceeding 50 vol. % may lead to increased grain boundary scattering at a heterogeneous interface (translucent ceramic material/fluorescent ceramic material), resulting in insufficient translucency (and thus lowered fluorescence intensity).

Thus, an $A_3B_5O_{12}$:Ce content of 5 to 50 vol. % leads to an increase in fluorescence intensity (i.e., emission intensity). This promotes achievement of uniform luminance and effectively reduces color unevenness.

(4) In a fourth aspect of the present invention, the Ce content of the $A_3B_5O_{12}$:Ce is 10.0 mol % or less (exclusive of 0) relative to the element A.

The Ce content falling within a range according to the fourth aspect achieves satisfactory fluorescent properties. When the Ce content (Ce concentration) exceeds 10.0 mol %, concentration quenching is likely to occur, resulting in low fluorescence intensity. No fluorescence occurs when Ce is free (i.e., the Ce content is 0 mol %).

(5) In a fifth aspect of the present invention, the ceramic plate has, on its surface located on the other side in the thickness direction thereof (e.g., a light radiation surface), a translucent antireflection layer for preventing light reflection.

According to the fifth aspect, the antireflection layer (i.e., AR coating) is provided on the light radiation surface through which light is emitted from the inside of the ceramic plate to the outside thereof, and thus light is effectively emitted from the inside of the ceramic plate to the outside thereof. This advantageously increases the emission intensity of the optical wavelength conversion member.

The antireflection layer may be formed of a material such as niobium oxide, titanium oxide, tantalum oxide, aluminum oxide, zirconium oxide, silicon oxide, aluminum nitride, silicon nitride, or magnesium fluoride. The antireflection layer may have a single-layer or multilayer structure.

(6) A sixth aspect of the present invention provides a light-emitting device comprising an optical wavelength conversion member as recited in any of the first to fifth aspects, wherein light is incident on the surface of the optical wavelength conversion member on which the dielectric multilayer film is provided.

According to the sixth aspect, light is incident on the surface of the optical wavelength conversion member on which the dielectric multilayer film is provided, and thus the light (i.e., fluorescence) having a wavelength converted by means of the ceramic plate exhibits high fluorescence intensity and high color uniformity. Therefore, the optical wavelength conversion member including the ceramic plate provided with the dielectric multilayer film exhibits high fluorescence intensity and high color uniformity.

Thus, the light-emitting device can emit to the outside light having high intensity and high color uniformity. The light-emitting device may include any known light-emitting element, such as LED or LD.

<Characteristic Features of the Present Invention Will Now Be Described>

The aforementioned "ceramic plate" is formed of a polycrystalline ceramic sintered body having the aforementioned characteristics. Crystal grains or the grain boundary therebetween may contain an unavoidable impurity.

The term "main components" described above refers to any component present in a predominant amount (volume) in the ceramic plate.

The term "$A_3B_5O_{12}$:Ce" described above refers to the case where a portion of A contained in $A_3B_5O_{12}$ is substituted by Ce through formation of a solid solution. The compound having such a structure exhibits fluorescent properties.

The "average surface roughness Sa (i.e., arithmetic average roughness Sa)" described above is a three-dimensional extension of two-dimensional arithmetic average roughness Ra and is a parameter standardized by ISO 25178.

MODES FOR CARRYING OUT THE INVENTION

Next will be described embodiments of the optical wavelength conversion member and the light-emitting device of the present invention.

1. First Embodiment

[1-1. Light-Emitting Device]

Now will be described a light-emitting device including an optical wavelength conversion member according to a first embodiment.

Figure 1:
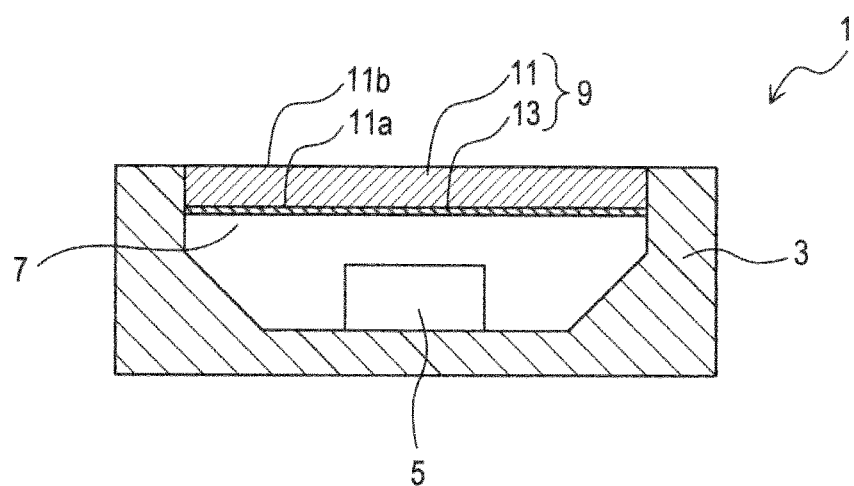
FIG. 1 Cross-sectional view (in a thickness direction) of a light-emitting device including an optical wavelength conversion member according to a first embodiment.

As shown in FIG. 1, a light-emitting device 1 of the first embodiment includes a box-shaped ceramic package (container) 3 formed of, for example, alumina; a light-emitting element 5 (e.g., LD) disposed in the interior of the container 3; and a plate-like optical wavelength conversion member 9 disposed so as to cover an opening 7 of the container 3.

As detailed below, the optical wavelength conversion member 9 includes a ceramic plate 11 and a dielectric multilayer film 13 formed on a light incident surface 11a (i.e., one main surface) of the ceramic plate 11.

In the light-emitting device 1, light emitted from the light-emitting element 5 is applied to the dielectric multilayer film 13 of the optical wavelength conversion member 9, and the light transmits through the dielectric multilayer film 13 and then is introduced into the translucent ceramic plate 11. A portion of the light introduced into the ceramic plate 11 transmits through the ceramic plate 11, and the wavelength of the remaining portion of the light is converted in the interior of the ceramic plate 11. Thus, the optical wavelength conversion member 9 (specifically the ceramic plate 11) emits fluorescence having a wavelength different from that of the light emitted from the light-emitting element 5.

Light containing the wavelength-converted light component is emitted to the outside through the other surface of the optical wavelength conversion member 9 (i.e., a light radiation surface 11b of the ceramic plate 11).

For example, the optical wavelength conversion member 9 converts the wavelength of blue light emitted from an LD, whereby the optical wavelength conversion member 9 as a whole emits white light to the outside (e.g., upward in FIG. 1).

[1-2. Optical Wavelength Conversion Member]

The optical wavelength conversion member 9 will now be described in detail.

The optical wavelength conversion member 9 of the first embodiment includes the ceramic plate 11 and the dielectric multilayer film 13 formed on one surface (lower surface) of the ceramic plate 11 in a thickness direction (the vertical direction in FIG. 1); i.e., on the light incident surface 11a shown in FIG. 1.

Specifically, the ceramic plate 11 is composed of a polycrystalline ceramic sintered body containing, as main components, $Al_2O_3$ (i.e., $Al_2O_3$ crystal grains) and crystal grains of a component represented by formula $A_3B_5O_{12}$:Ce (i.e., $A_3B_5O_{12}$:Ce crystal grains).

The ceramic plate 11 has a porosity of 2 vol. % or less, and the light incident surface 11a (i.e., surface on which light is incident) and the light radiation surface 11b (i.e., surface from which light emits; opposite the light incident surface 11a) have an average surface roughness Sa (i.e., arithmetic average roughness Sa) of 0.5 μm or less.

The ceramic plate 11 has a garnet structure represented by $A_3B_5O_{12}$:Ce wherein each of A and B is at least one element selected from the following element groups:
A: Sc, Y, and lanthanoids (except for Ce), and
B: Al and Ga.

The ceramic plate 11 has an $A_3B_5O_{12}$:Ce content of 5 to 50 vol. %.

In the ceramic plate 11, the Ce content of the $A_3B_5O_{12}$:Ce is 10 mol % or less (exclusive of 0) relative to the element A.

Figure 2:
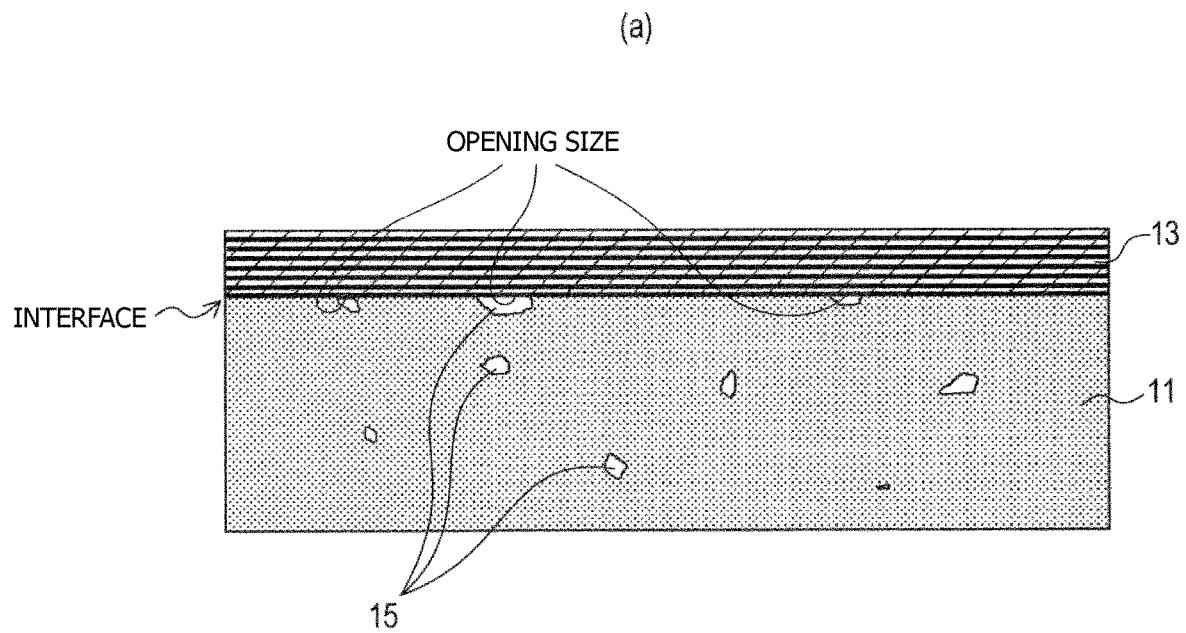
FIG. 2 (a) Cross-sectional view (in a thickness direction) of the optical wavelength conversion member according to the first embodiment. (b) Enlarged cross-sectional view of a portion of FIG. 2(a) (wherein a dent is filled with a portion of a dielectric multilayer film).
Figure 2:
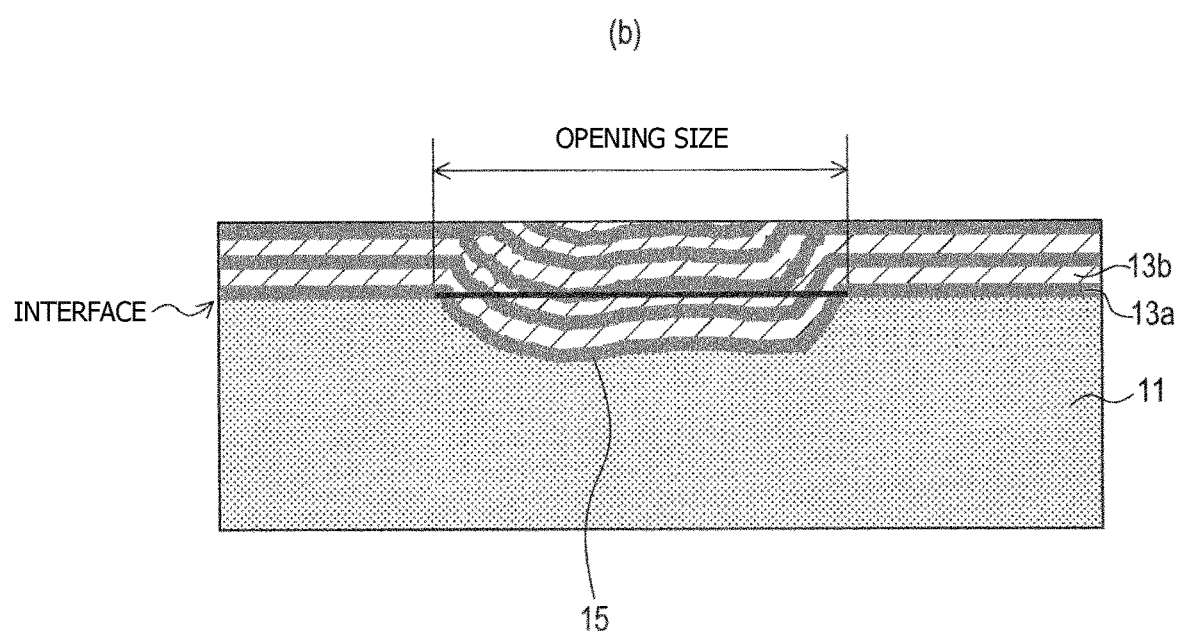

As shown in FIG. 2, the ceramic plate 11 has open pores 15 at the interface between the dielectric multilayer film 13 and the ceramic plate 11 in a cross section of the optical wavelength conversion member 9 in the thickness direction. The number of open pores 15 is 30 or less per 100 μm of the length of the interface (i.e., the length of a straight line along the interface). Each open pore 15 has an opening size of 2 μm or less.

Thus, each of one or more open pores 15 at the interface (i.e., open pores 15 at the aforementioned straight line) has a length of 2 μm or less between the edges of the open pore along the straight line.

The dielectric multilayer film 13 includes stacked translucent layers having different refractive indices. As shown in FIG. 2(b), the dielectric multilayer film 13 includes one or more high refractive index films 13a and one or more refractive index films 13b. As shown in FIG. a plurality of high refractive index films 13a and a plurality of low refractive index films 13b are alternately disposed one by one.

The dielectric multilayer film 13 can be modified for controlling the stacking state of the high refractive index films 13a and the low refractive index films 13b, so that the dielectric multilayer film 13 has a function of transmitting or reflecting light of a specific wavelength.

The dielectric multilayer film 13 can be modified by using any method for forming a dichroic coating.

Since a technique for forming a dichroic coating is well known, detailed description thereof is omitted. Briefly, about 2 to 100 layers having a regulated refractive index and thickness can be stacked to achieve an overall thickness of about 0.1 to 20 μm, so that the resultant multilayer film has a function of transmitting or reflecting light of a specific wavelength.

For example, when high refractive index films 13*a* formed of titanium oxide and low refractive index films 13*b* formed of silicon oxide are alternately stacked and the thicknesses of the layers are regulated (the number of layers: 40, overall thickness: 3 μm), the resultant multilayer film exhibits, for example, a function of transmitting blue light (wavelength: 465 nm) and reflecting light (wavelength: 520 nm or more) emitted from the ceramic plate 11 (i.e., phosphor); i.e., wavelength-converted light.

Thus, since light having a wavelength converted by means of the ceramic plate 11 is effectively reflected at the dielectric multilayer film 13 in the optical wavelength conversion member 9, a reduced amount of light is returned through the light incident surface 11*a* toward the light-emitting element 5 (downward in FIG. 1). Therefore, light emitted from the ceramic plate 11 (i.e., phosphor) can be effectively extracted through the light radiation surface 11*b*.

[1-2. Production Method for Optical Wavelength Conversion Member]

A production process for the optical wavelength conversion member 9 will now be briefly described.

Powder materials for the ceramic plate 11 (i.e., ceramic sintered body) were weighed so as to satisfy the aforementioned requirement of the first embodiment (i.e., the powder materials were prepared).

Subsequently, an organic solvent and a dispersant were added to the prepared powder materials, and these materials were ground and mixed in a ball mill.

Subsequently, the powder prepared through grind-mixing was mixed with a resin, to thereby prepare a slurry.

The slurry was then formed into a sheet compact by means of doctor blading.

The sheet compact was then degreased.

The degreased sheet compact was fired in an air atmosphere for 3 to 20 hours, to thereby yield the ceramic plate 11 (i.e., ceramic sintered body).

The light incident surface 11*a* and the light radiation surface 11*b* of the ceramic plate 11 were polished with diamond abrasive grains, to thereby achieve an average surface roughness Sa of 0.5 μm or less.

Subsequently, the dielectric multilayer film 13 (i.e., a well-known dichroic coating) was formed on the light incident surface 11*a* of the ceramic plate 11.

Specifically, high refractive index films 13*a* formed of titanium oxide and low refractive index films 13*b* formed of silicon oxide were alternately stacked, and the thicknesses of the layers were regulated, to thereby form the dielectric multilayer film 13 (the number of layers: 40, overall thickness: 3 μm). This process produced the optical wavelength conversion member 9 including the dielectric multilayer film 13 on the light incident surface 11*e* of the ceramic plate 11.

[1-3. Effects]

The effects of the first embodiment will now be described.

(1) The optical wavelength conversion member 9 of the present embodiment includes the polycrystalline ceramic plate 11 containing, as main components, $Al_2O_3$ and a component represented by $A_3B_5O_{12}$:Ce, and each of A and B of the $A_3B_5O_{12}$ is at least one element selected from the following element groups:

A: Sc, Y, and lanthanoids (except for Ce), and

B: Al and Ga.

The aforementioned technical feature can achieve effective conversion of blue light into yellow light.

The light incident surface 11*a* of the ceramic plate 11 is provided with the dielectric multilayer film 13 having a function of transmitting or reflecting light of a specific wavelength. Thus, light emitted from the ceramic plate 11 (i.e., phosphor) can be effectively extracted.

In addition, the ceramic plate 11 has a porosity of 2 vol. % or less and an average surface roughness Sa of 0.5 μm or less. This can achieve effective extraction of light, and can facilitate formation of the smooth dielectric multilayer film 13 that is less likely to cause color unevenness.

Thus, the technical feature of the first embodiment can achieve, for example, reduced color unevenness and high light extraction efficiency, resulting in high fluorescence intensity (i.e., high emission intensity). Furthermore, the optical wavelength conversion member 9 (i.e., phosphor) can be used with a high-output light source (e.g., laser) and exhibits high durability and high thermal resistance.

(2) In the first embodiment, the ceramic plate 11 has open pores 15 at the interface between the dielectric multilayer film 13 and the ceramic plate 11 in a cross section of the optical wavelength conversion member 9 in the thickness direction. The number of open pores 15 is 30 or less per 100 μm of the length of the interface, and each open pore 15 has an opening size of 2 μm or less.

Thus, the dielectric multilayer film 13 has further smoothness and sufficiently exhibits its functions. Therefore, light emitted from the phosphor can be more effectively extracted, and occurrence of color unevenness can be reduced.

(3) In the first embodiment, the ceramic plate 11 has an $A_3B_5O_{12}$:Ce content of 5 to 50 vol. %. Thus, since the amount of the fluorescent material is sufficient (i.e., 5 vol. % or more), satisfactory fluorescence intensity is achieved. Since the amount of the fluorescent material is 50 vol. % or less (i.e., an appropriate amount), grain boundary scattering is less likely to increase at a heterogeneous interface (translucent ceramic material/fluorescent ceramic material), resulting in sufficient translucency.

Thus, an $A_3B_5O_{12}$:Ce content of 5 to 50 vol. % leads to an increase in fluorescence intensity (i.e., emission intensity). This promotes achievement of uniform luminance and effectively reduces color unevenness.

(4) In the first embodiment, the Ce content of the $A_3B_5O_{12}$:Ce is 10.0 mol % or less (exclusive of 0) relative to the element A.

Since the Ce content (Ce concentration) is 10.0 mol % or less, concentration quenching is less likely to occur, resulting in an advantage of high fluorescence intensity.

(5) In the light-emitting device 1 of the first embodiment, light is incident on the surface of the optical wavelength conversion member 9 on which the dielectric multilayer film 13 is provided (i.e., on the light incident surface 11*a*).

In the first embodiment, light is incident on the surface of the optical wavelength conversion member 9 on which the dielectric multilayer film 13 is provided, and thus the light (i.e., fluorescence) having a wavelength converted by means of the ceramic plate 11 is less likely to scatter toward the light incident surface. Thus, the light is emitted through the light radiation surface 11*b* at high efficiency. Therefore, the light emitted from the optical wavelength conversion member 9 exhibits high fluorescence intensity and high color uniformity.

2. Second Embodiment

Now will be described a light-emitting device including an optical wavelength conversion member according to a second embodiment.

Description of the same components as those in the first embodiment is omitted or simplified. The same components as those in the first embodiment are denoted by the same reference numerals.

Figure 3:
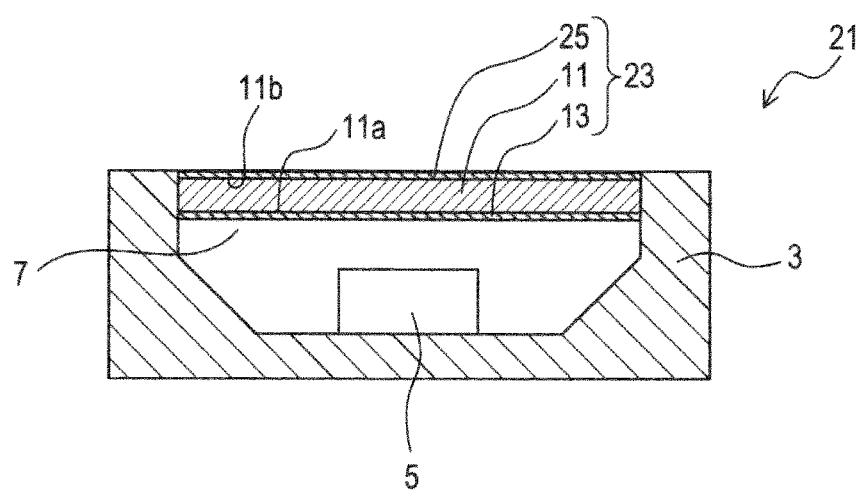
FIG. 3 Cross-sectional view (in a thickness direction) of a light-emitting device including an optical wavelength conversion member according to a second embodiment.

As shown in FIG. 3, a light-emitting device 21 of the second embodiment includes a ceramic container 3; a light-emitting element 5 disposed in the interior of the container 3; and a plate-like optical wavelength conversion member 23 disposed so as to cover an opening 7 of the container 3, as in the case of the first embodiment.

The optical wavelength conversion member 23 includes a ceramic plate 11; a dielectric multilayer film 13 formed on a light incident surface 11a of the ceramic plate 11; and an antireflection layer 25 formed on a light radiation surface 11b of the ceramic plate 11.

The antireflection layer 25 is a translucent layer formed of, for example, magnesium fluoride for preventing light reflection.

The antireflection layer 25 can be prepared through formation of a magnesium fluoride single-layer film by means of, for example, sputtering.

In the light-emitting device 21, light emitted from the light-emitting element 5 transmits through the dielectric multilayer film 13, and the wavelength of the light is converted in the interior of the ceramic plate 11. The wavelength-converted light is emitted to the outside through the antireflection layer 25.

The second embodiment achieves the same effects as in the first embodiment. Since the optical wavelength conversion member 23 includes the antireflection layer 25, light emitted from the ceramic plate 11 to the outside is less likely reflected at the light radiation surface 11b. Thus, light is more effectively emitted from the optical wavelength conversion member 23 to the outside.

3. Examples

The aforementioned embodiments will next be described in detail by way of Examples.

In Examples 1 to 4, optical wavelength conversion member samples (Nos. 1 to 43) each including a ceramic sintered body (i.e., ceramic plate) were prepared under the conditions shown in Tables 1 and 2 below. Samples Nos. 2 to 17, 19 to 26, and 28 to 43 fall within the scope of the present invention (the aforementioned first aspect), and samples Nos. 1, 18, and 27 (i.e., samples of Comparative Examples) fall outside the scope of the present invention (the aforementioned first aspect).

1) Production Process for Ceramic Sintered Body

Now will be described a production method for a ceramic sintered body in each of the Examples.

For preparation of each of samples (Nos. 1 to 36), $Al_2O_3$ powder (mean particle size: 0.3 μm), $Y_2O_3$ powder (mean particle size: 1.2 μm), and $CeO_2$ powder (mean particle size: 1.5 μm) were weighed so that the amount of YAG ($Y_3Al_5O_{12}$) was 1 to 60 vol. % in a ceramic sintered body and the Ce content was 0.1 to 15 mol % relative to Y in YAG as shown in Table 1.

In samples Nos. 37 to 43, YAG was replaced with a material having an $A_3B_5O_{12}$ composition shown in Table 1.

Subsequently, the weighed powder materials were added to a ball mill together with pure water, a specific amount of a binder (20 wt. % in terms of solid content, relative to the raw material powders), and a dispersant (1 wt. % in terms of solid content, relative to the raw material powders), and these materials were grind-mixed for 12 hours.

The resultant slurry was formed into a sheet compact by means of doctor blading.

Subsequently, the sheet compact was degreased and then fired in an air atmosphere at 1,450° C. to 1,750° C. for 3 to 20 hours.

Thus, ceramic sintered bodies (for samples Nos. 1 to 43) were prepared. Each ceramic sintered body had a plate form (a rectangular parallelepiped shape) and dimensions of 20 mm×20 mm×0.5 mm (thickness).

2) Adjustment of Surface Roughness of Ceramic Sintered Body

Now will be described a method for adjustment of the surface roughness (average surface roughness Sa) of a ceramic sintered body.

The surface roughness of a ceramic sintered body was adjusted by using abrasive grains with different sizes during mirror polishing of both surfaces (in a thickness direction) of the ceramic sintered body.

The porosity of the above-prepared ceramic sintered body was measured by means of a microscope (manufactured by Keyence Corporation). Specifically, the mirror-polished surface of the ceramic sintered body was observed, and an image (×500) was obtained at any position of the surface. The image was subjected to image processing, to thereby calculate the porosity.

The average surface roughness Sa (i.e., arithmetic average roughness Sa) of the mirror-polished surface of each ceramic sintered body was measured by means of a non-contact three-dimensional measuring apparatus Infinite Focus G5 (manufactured by Alicona Imaging). The results are shown in Table 2 below.

The average surface roughness Sa (i.e., arithmetic average roughness Sa) is a three-dimensional extension of two-dimensional arithmetic average roughness Ra and is a parameter standardized by ISO 25178.

3) Formation Method for Dielectric Multilayer Film

Now will be described a method for forming a dielectric multilayer film.

A dielectric multilayer film was formed on one surface (in a thickness direction) (i.e., a light incident surface) of the above-mirror-polished ceramic sintered body by means of sputtering. Thus, an optical wavelength conversion member (i.e., sample) was produced.

Specifically, a dielectric multilayer film (in which the number of layers and the thicknesses thereof were regulated) was formed to achieve optical properties such that when light is vertically incident on the light incident surface of each ceramic sintered body (i.e., ceramic plate), the dielectric multilayer film transmits 90% or more of light having a wavelength of 350 to 480 nm and reflects 90% or more of light having a wavelength of 500 nm or more.

For example, a multilayer film having such optical properties can be formed through stacking of 40 layers (overall thickness: 3 μm) by use of titanium oxide and silicon oxide.

Specifically, a dielectric multilayer film having the aforementioned properties can be formed by alternate stacking of titanium oxide layers and silicon oxide layers under control of the thicknesses of the layers.

The dielectric multilayer film may be formed by means of vacuum deposition or ion plating in place of sputtering.

4) Subsequently, the above-prepared optical wavelength conversion member samples were examined for the following properties (a) to (d). The results are shown in Table 2 below.

(a) Relative Density

The density of each ceramic sintered body was measured by the Archimedes method, and the measured density was converted into a relative density.

(b) Fluorescence Intensity

Blue LD light (wavelength: 465 nm) was focused to a width of 0.5 mm by means of a lens, and the surface of each sample on which the dielectric multilayer film was formed was irradiated with the focused light. The light transmitting through the sample was focused by means of a lens, and the emission intensity was measured by means of a power sensor.

The sample was irradiated with the light at a power density of 40 W/mm$^2$. The emission intensity was evaluated by a value relative to that (taken as 100) of a YAG:Ce single-crystal body.

(c) Color Unevenness (Variation in Color)

Variation in color was evaluated through determination of a variation in chromaticity by means of a color illuminometer.

Blue LD light (wavelength: 465 nm) was focused to a width of 0.3 mm by means of a lens, and the surface of each sample on which the dielectric multilayer film was formed was irradiated with the focused light. A color illuminometer was used to determine the chromaticity of the light transmitting through the surface of the sample opposite the surface irradiated with the focused light.

The light irradiation was performed on a 18 mm square region (at intervals of 3 mm in the region) at the center of the irradiation surface of the sample, and a variation in chromaticity (in X-direction) (i.e., a variation in color: color unevenness) was evaluated. As used herein, the term "variation in color" refers to the maximum deviation of chromaticity (in X-direction).

(d) Observation of Cross Section

Each optical wavelength conversion member sample having the dielectric multilayer film was cut in a thickness direction, and the cut surface was subjected to mirror polishing. Subsequently, the mirror-polished surface was observed under a scanning electron microscope (i.e., SEM observation), and images (×5,000) were obtained any portions of the interface between the dielectric multilayer film and the ceramic plate. The images were joined together so that the interfacial length reached 100 μm or more. In the resultant image, the number of pores present at the interface was counted, and the opening sizes of the pores were measured.

The term "interface" as used in Table 2 refers to the interface between the dielectric multilayer film and the ceramic plate. The term "maximum pore opening size" as used in Table 2 refers to the maximum of opening sizes of a plurality of pores at the interface (specifically at a line of 100 μm along the cross section).

Example 1

Next will be described in detail, for example, the properties (a) to (d) of samples (Nos. 1 to 9) of Examples 1 determined by the aforementioned methods.

In Example 1, each ceramic sintered body was prepared so that the YAG content of the ceramic sintered body was 21 vol. % and the Ce content was 0.7 mol % relative to Y in YAG. The surface roughness (average surface roughness Sa) of the ceramic sintered body was modified, and a dielectric multilayer film was formed on the surface having modified average surface roughness Sa, to thereby prepare a sample. The sample was evaluated for its properties. The results are shown in Table 2 below.

As shown in Table 2 below, sample No. 1, which was provided with no dielectric multilayer film, exhibited slightly low fluorescence intensity Samples Nos. 2 to 8, which had an average surface roughness Sa of 0.5 μm or less and were provided with a dielectric multilayer film, exhibited high fluorescence intensity and reduced variation in color. That is, these samples exhibited good results in terms of fluorescence intensity and variation in color.

In contrast, sample No. 9, which had an average surface roughness Sa of more than 0.5 μm, exhibited low fluorescence intensity and increased variation in color.

All the samples of Example 1 exhibited a relative density of 99% or more; i.e., the samples were sufficiently densified.

Example 2

In Example 2, as shown in Tables 1 and 2 below, samples (Nos. 10 to 18) were prepared and evaluated in the same manner as in Example 1.

Particularly in Example 2, each ceramic sintered body was prepared so that the YAG content of the ceramic sintered body was 21 vol. % and the Ce content was 0.7 mol % relative to Y in YAG. In Example 2, the porosity of the ceramic sintered body was regulated under control of firing conditions. A dielectric multilayer film was formed on the surface having modified average surface roughness Sa, to thereby prepare a sample. The sample was evaluated for its properties.

Samples Nos. 10 to 16, which had a porosity of 2 vol. % or less, exhibited good results in terms of fluorescence intensity and variation in color. That is, these examples exhibited high fluorescence intensity and reduced variation in color.

In contrast, sample No. 17, which had a maximum pore opening size of more than 2 μm at the dielectric multilayer film/ceramic plate interface, exhibited high fluorescence intensity but increased variation in color.

Sample No. 18, which had a porosity of more than 2 vol. % and more than 30 pores at the dielectric multilayer film/ceramic plate interface, exhibited low fluorescence intensity and increased variation in color.

All the samples of Example 2 exhibited a relative density of 99% or more; i.e., the samples were sufficiently densified.

Example 3

In Example 3, as shown in Tables 1 and 2 below, samples (Nos. 19 to 36) were prepared and evaluated in the same manner as in Example 1.

Particularly in Example 3, each ceramic sintered body was prepared so that the YAG content of the ceramic sintered body was 2 to 60 vol. % and the Ce content was 0 to 15 mol % relative to Y in YAG. The average surface roughness Sa of the ceramic sintered body was modified, and a dielectric multilayer film was formed on the surface having modified average surface roughness Sa, to thereby prepare a sample. The sample was evaluated for its properties.

Samples Nos. 20 to 25, which had a YAG content of the ceramic sintered body of 5 to 50 vol. %, exhibited good results in terms of fluorescence intensity and variation in color. That is, these examples exhibited high fluorescence intensity and reduced variation in color.

In contrast, sample No. 19 exhibited low fluorescence intensity and increased variation in color, whereas sample No. 26 exhibited reduced variation in color but slightly low fluorescence intensity.

Samples Nos. 28 to 35, which had a YAG content of the ceramic sintered body of 30 vol. % and a Ce content of 10 mol % or less (exclusive of 0) relative to Y in YAG, exhibited good results in terms of fluorescence intensity and variation in color. That is, these examples exhibited high fluorescence intensity and reduced variation in color.

Sample No. 27 exhibited no emission.

Sample No. 36 exhibited reduced variation in color but low fluorescence intensity.

All the samples of Example 3 exhibited a relative density of 99% or more; i.e., the samples were sufficiently densified.

Example 4

In Example 4, as shown in Tables 1 and 2 below, samples (Nos. 37 to 43) were prepared and evaluated in the same manner as in Example 1.

In Example 4, $Y_2O_3$ powder was used in combination with at least one of $Lu_2O_3$ powder (mean particle size: 1.3 μm), $Yb_2O_3$ powder (mean particle size: 1.5 μm), $Gd_2O_3$ powder (mean particle size: 1.5 μm), $Tb_2O_3$ powder (mean particle size: 1.6 μm), and $Ga_2O_3$ powder (mean particle size: 1.3 μm). During mixing of the raw materials, the proportions of the raw materials were varied so that specific $A_3B_5O_{12}$:Ce was synthesized.

The average surface roughness Sa of the resultant ceramic sintered body was modified, and a dielectric multilayer film suitable for emission wavelength was formed on the surface having modified average surface roughness Sa, to thereby prepare a sample. The sample was evaluated for its properties.

All the samples (i.e., samples Nos. 37 to 43) exhibited good results in terms of fluorescence intensity and variation in color. That is, these examples exhibited high fluorescence intensity and reduced variation in color.

All the samples of Example 4 exhibited a relative density of 99% or more; i.e., the samples were sufficiently densified.

Example 5

In Example 5, the light radiation surface of the ceramic sintered body of each of samples Nos. 2 to 8 prepared in Example 1 was provided with an antireflection layer formed of magnesium fluoride, to thereby prepare a sample.

The antireflection layer was formed to achieve optical properties such that when light is vertically incident on the ceramic sintered body (plate), the antireflection layer transmits 95% or more of light having a wavelength of 400 to 800 nm.

All the samples exhibited high fluorescence intensity and reduced variation in color.

TABLE 1

| Example | No. | Alumina [vol %] | $A_3B_5O_{12}$ composition | $A_3B_5O_{12}$:Ce [vol %] | Ce content [mol %] |
|---|---|---|---|---|---|
| Example 1 | 1 | 79 | $Y_3Al_5O_{12}$ | 21 | 0.7 |
|  | 2 | 79 | $Y_3Al_5O_{12}$ | 21 | 0.7 |
|  | 3 | 79 | $Y_3Al_5O_{12}$ | 21 | 0.7 |
|  | 4 | 79 | $Y_3Al_5O_{12}$ | 21 | 0.7 |
|  | 5 | 79 | $Y_3Al_5O_{12}$ | 21 | 0.7 |
|  | 6 | 79 | $Y_3Al_5O_{12}$ | 21 | 0.7 |
|  | 7 | 79 | $Y_3Al_5O_{12}$ | 21 | 0.7 |
|  | 8 | 79 | $Y_3Al_5O_{12}$ | 21 | 0.7 |
|  | 9 | 79 | $Y_3Al_5O_{12}$ | 21 | 0.7 |
| Example 2 | 10 | 79 | $Y_3Al_5O_{12}$ | 21 | 0.7 |
|  | 11 | 79 | $Y_3Al_5O_{12}$ | 21 | 0.7 |
|  | 12 | 79 | $Y_3Al_5O_{12}$ | 21 | 0.7 |
|  | 13 | 79 | $Y_3Al_5O_{12}$ | 21 | 0.7 |
|  | 14 | 79 | $Y_3Al_5O_{12}$ | 21 | 0.7 |
|  | 15 | 79 | $Y_3Al_5O_{12}$ | 21 | 0.7 |
|  | 16 | 79 | $Y_3Al_5O_{12}$ | 21 | 0.7 |
|  | 17 | 79 | $Y_3Al_5O_{12}$ | 21 | 0.7 |
|  | 18 | 79 | $Y_3Al_5O_{12}$ | 21 | 0.7 |
| Example 3 | 19 | 98 | $Y_3Al_5O_{12}$ | 3 | 0.7 |
|  | 20 | 95 | $Y_3Al_5O_{12}$ | 5 | 0.7 |
|  | 21 | 90 | $Y_3Al_5O_{12}$ | 10 | 0.7 |
|  | 22 | 80 | $Y_3Al_5O_{12}$ | 20 | 0.7 |
|  | 23 | 70 | $Y_3Al_5O_{12}$ | 30 | 0.7 |
|  | 24 | 60 | $Y_3Al_5O_{12}$ | 40 | 0.7 |
|  | 25 | 50 | $Y_3Al_5O_{12}$ | 50 | 0.7 |
|  | 26 | 40 | $Y_3Al_5O_{12}$ | 60 | 0.7 |
|  | 27 | 70 | $Y_3Al_5O_{12}$ | 30 | 0 |
|  | 28 | 70 | $Y_3Al_5O_{12}$ | 30 | 0.1 |
|  | 29 | 70 | $Y_3Al_5O_{12}$ | 30 | 0.3 |
|  | 30 | 70 | $Y_3Al_5O_{12}$ | 30 | 0.5 |
|  | 31 | 70 | $Y_3Al_5O_{12}$ | 30 | 1 |
|  | 32 | 70 | $Y_3Al_5O_{12}$ | 30 | 1.5 |
|  | 33 | 70 | $Y_3Al_5O_{12}$ | 30 | 3 |
|  | 34 | 70 | $Y_3Al_5O_{12}$ | 30 | 5 |
|  | 35 | 70 | $Y_3Al_5O_{12}$ | 30 | 10 |
|  | 36 | 70 | $Y_3Al_5O_{12}$ | 30 | 15 |
| Example 4 | 37 | 79 | $Lu_3Al_5O_{12}$ | 21 | 0.7 |
|  | 38 | 79 | $Y_{1.5}Lu_{1.5}Al_5O_{12}$ | 21 | 0.7 |
|  | 39 | 79 | $Yb_3Al_5O_{12}$ | 21 | 0.7 |
|  | 40 | 79 | $Y_{1.5}Gd_{1.5}Al_5O_{12}$ | 21 | 0.7 |
|  | 41 | 79 | $Y_{1.5}Yb_{1.5}Al_5O_{12}$ | 21 | 0.7 |
|  | 42 | 79 | $Y_{1.5}Tb_{1.5}Al_5O_{12}$ | 21 | 0.7 |
|  | 43 | 79 | $Y_3Al_5Ga_1O_{12}$ | 21 | 0.7 |

TABLE 2

| Example | No. | Porosity [%] | Sa [μm] | Dielectric multilayer film | Number of pores at interface | Maximum pore opening size at interface [μm] | Fluorescence intensity | Variation in color |
|---|---|---|---|---|---|---|---|---|
| Example 1 | 1 | 0.03 | 0.02 | Absence | — | — | 145 | 0.014 |
|  | 2 | 0.03 | 0.02 | Presence | 0 | 0 | 290 | 0.014 |
|  | 3 | 0.03 | 0.03 | Presence | 1 | 0.4 | 283 | 0.018 |
|  | 4 | 0.03 | 0.05 | Presence | 2 | 0.5 | 265 | 0.021 |
|  | 5 | 0.03 | 0.1 | Presence | 2 | 0.4 | 246 | 0.026 |
|  | 6 | 0.03 | 0.15 | Presence | 3 | 0.5 | 219 | 0.028 |
|  | 7 | 0.03 | 0.3 | Presence | 2 | 0.4 | 194 | 0.035 |
|  | 8 | 0.03 | 0.5 | Presence | 3 | 0.5 | 176 | 0.047 |
|  | 9 | 0.03 | 0.7 | Presence | 3 | 0.6 | 130 | 0.058 |

TABLE 2-continued

| Example | No. | Porosity [%] | Sa [μm] | Dielectric multilayer film | Number of pores at interface | Maximum pore opening size at interface [μm] | Fluorescence intensity | Variation in color |
|---|---|---|---|---|---|---|---|---|
| Example 2 | 10 | 0.02 | 0.02 | Presence | 0 | 0 | 295 | 0.014 |
|  | 11 | 0.05 | 0.02 | Presence | 2 | 0.4 | 287 | 0.021 |
|  | 12 | 0.1 | 0.04 | Presence | 5 | 0.7 | 276 | 0.028 |
|  | 13 | 0.3 | 0.06 | Presence | 7 | 0.7 | 245 | 0.03 |
|  | 14 | 0.9 | 0.07 | Presence | 10 | 0.9 | 232 | 0.031 |
|  | 15 | 1.6 | 0.11 | Presence | 15 | 1.5 | 208 | 0.034 |
|  | 16 | 2 | 0.14 | Presence | 27 | 1.6 | 184 | 0.045 |
|  | 17 | 2 | 0.15 | Presence | 27 | 2.5 | 158 | 0.052 |
|  | 18 | 2.3 | 0.18 | Presence | 38 | 1.8 | 145 | 0.063 |
| Example 3 | 19 | 0.02 | 0.02 | Presence | 2 | 0.3 | 149 | 0.048 |
|  | 20 | 0.02 | 0.02 | Presence | 1 | 0.4 | 175 | 0.043 |
|  | 21 | 0.02 | 0.02 | Presence | 2 | 0.4 | 243 | 0.025 |
|  | 22 | 0.03 | 0.02 | Presence | 1 | 0.3 | 288 | 0.015 |
|  | 23 | 0.03 | 0.02 | Presence | 1 | 0.3 | 296 | 0.013 |
|  | 24 | 0.03 | 0.02 | Presence | 3 | 0.4 | 226 | 0.014 |
|  | 25 | 0.04 | 0.02 | Presence | 4 | 0.4 | 189 | 0.012 |
|  | 26 | 0.04 | 0.02 | Presence | 6 | 0.4 | 148 | 0.013 |
|  | 27 | 0.03 | 0.02 | Presence | 0 | 0 | — | — |
|  | 28 | 0.03 | 0.02 | Presence | 0 | 0 | 195 | 0.043 |
|  | 29 | 0.04 | 0.02 | Presence | 0 | 0 | 254 | 0.031 |
|  | 30 | 0.03 | 0.02 | Presence | 2 | 0.4 | 281 | 0.024 |
|  | 31 | 0.02 | 0.02 | Presence | 1 | 0.3 | 278 | 0.013 |
|  | 32 | 0.03 | 0.02 | Presence | 3 | 0.4 | 248 | 0.016 |
|  | 33 | 0.02 | 0.02 | Presence | 4 | 0.5 | 234 | 0.017 |
|  | 34 | 0.04 | 0.02 | Presence | 3 | 0.4 | 215 | 0.019 |
|  | 35 | 0.03 | 0.02 | Presence | 4 | 0.3 | 156 | 0.018 |
|  | 36 | 0.04 | 0.02 | Presence | 3 | 0.5 | 128 | 0.025 |
| Example 4 | 37 | 0.03 | 0.02 | Presence | 0 | 0 | 235 | 0.014 |
|  | 38 | 0.03 | 0.02 | Presence | 0 | 0 | 233 | 0.014 |
|  | 39 | 0.03 | 0.02 | Presence | 0 | 0 | 223 | 0.01 |
|  | 40 | 0.03 | 0.02 | Presence | 0 | 0 | 231 | 0.01 |
|  | 41 | 0.03 | 0.02 | Presence | 0 | 0 | 235 | 0.012 |
|  | 42 | 0.03 | 0.02 | Presence | 0 | 0 | 233 | 0.012 |
|  | 43 | 0.03 | 0.02 | Presence | 0 | 0 | 235 | 0.014 |

4. Other Embodiments

Needless to say, the present invention is not limited to the aforementioned embodiment, but may be implemented in various other forms without departing from the scope of the invention.

(1) For example, the formation of the dichroic coating may be requested to a dichroic coating manufacturer.

(2) The aforementioned optical wavelength conversion member or light-emitting device can be used for various applications, including fluorescent bodies, optical wavelength conversion apparatuses, head lamps, lighting apparatuses, and optical apparatuses (e.g., projectors).

(3) In each of the aforementioned embodiments, the function of a single component may be shared by a plurality of components, or a single component may exert the functions of a plurality of components. Some of the components in each of the aforementioned embodiments may be omitted. At least some of the components in each of the aforementioned embodiments may be, for example, added to or replaced with components in another embodiment. Embodiments of the present invention encompass any form included in technical ideas specified by the appended claims.

DESCRIPTION OF REFERENCE NUMERALS

1, 21: light-emitting device; 5: light-emitting element; 9, 23: optical wavelength conversion member; 11: ceramic plate; 13: dielectric multilayer film; and 25: antireflection layer

The invention claimed is:

1. An optical wavelength conversion member comprising a polycrystalline ceramic plate containing, as main components, $Al_2O_3$ and a component represented by $A_3B_5O_{12}$:Ce, the optical wavelength conversion member being characterized in that:
   each of A and B of the $A_3B_5O_{12}$ is at least one element selected from the following element groups:
   A: Sc, Y, and lanthanoids (except for Ce), and
   B: Al and Ga; and
   the ceramic plate has a porosity of 0.05 vol. % or less and an average surface roughness (arithmetic average roughness Sa) of 0.5 μm or less, and the ceramic plate has, on its surface located on one side in a thickness direction thereof, a dielectric multilayer film including stacked translucent layers having different refractive indices.

2. An optical wavelength conversion member according to claim 1, wherein the ceramic plate has open pores at the interface between the dielectric multilayer film and the ceramic plate in a cross section of the optical wavelength conversion member in the thickness direction; the number of open pores is 30 or less per 100 μm of the length of the interface; and each open pore has an opening size of 2 μm or less.

3. An optical wavelength conversion member according to claim 1, wherein the ceramic plate has an $A_3B_5O_{12}$:Ce content of 5 to 50 vol. %.

4. An optical wavelength conversion member according to claim 1, wherein the Ce content of the $A_3B_5O_{12}$:Ce is 10.0 mol % or less (exclusive of 0) relative to the element A.

5. An optical wavelength conversion member according to claim 1, wherein the ceramic plate has, on its surface located on the other side in the thickness direction thereof, a translucent antireflection layer for preventing light reflection.

6. A light-emitting device comprising an optical wavelength conversion member as recited in claim 1, the light-emitting device being characterized in that:
  light is incident on the surface of the optical wavelength conversion member on which the dielectric multilayer film is provided.

7. An optical wavelength conversion member according to claim 1, wherein the dielectric multilayer film comprises a plurality of high refractive index films and a plurality of low refractive index films alternately disposed one by one, wherein the high refractive index films have a refractive index that is higher those of the low refractive index films.

8. An optical wavelength conversion member according to claim 1, wherein the dielectric multilayer film transmits or reflects light of a specific wavelength.

9. An optical wavelength conversion member according to claim 1, wherein the dielectric multilayer film comprises a dichroic coating.

10. An optical wavelength conversion member according to claim 7, wherein the dielectric multilayer film comprises alternately stacked high refractive index titanium oxide films and low refractive index silicon oxide films.

* * * * *